United States Patent [19]

Rarig et al.

[11] 4,351,263
[45] Sep. 28, 1982

[54] APPARATUS FOR SENSING BARE METAL ON A MOVING STRIP OF INSULATIVELY COATED CONDUCTIVE MATERIAL

[75] Inventors: Larry L. Rarig; Raymond A. Alleman, both of Lancaster; Dennis L. Miller, Ephrata, all of Pa.

[73] Assignee: RCA Corporation, New York, N.Y.

[21] Appl. No.: 278,450

[22] Filed: Jun. 29, 1981

[51] Int. Cl.³ .............................................. G01R 19/00
[52] U.S. Cl. .................................. 118/665; 118/670; 118/672; 324/133
[58] Field of Search ....................... 118/665, 670, 672; 324/133

[56] References Cited

U.S. PATENT DOCUMENTS 4,126,510 11/1978 Moscony et al. .................. 156/626

Primary Examiner—James R. Hoffman
Attorney, Agent, or Firm—Eugene M. Whitacre; Dennis H. Irlbeck; Lester L. Hallacher

[57] ABSTRACT

An apparatus for detecting bare metal on a conductive strip which is coated with an insulative material includes sensors arranged near the edges of and on both sides of the strip. Each sensor includes a plurality of electrical contacts, one of which is grounded and the others of which are voltage biased. When one or more voltage biased contacts in one sensor are electrically connected to the grounded contact in another sensor, bare metal is indicated.

12 Claims, 5 Drawing Figures

APPARATUS FOR SENSING BARE METAL ON A MOVING STRIP OF INSULATIVELY COATED CONDUCTIVE MATERIAL

BACKGROUND OF THE INVENTION

This invention relates generally to the production of shadow masks for color television tubes and particularly to an apparatus and method detecting bare metal prior to the acid etching of such masks.

A colored television tube includes a shadow mask which serves as the color selection electrode. The shadow mask includes a large number of apertures through which the electron beams pass to impact a phosphor of the proper color. Typically, in the manufacture of shadow masks the aperture pattern is photographically reproduced on a photoresistive material which covers both sides of the conductive metal strip from which the masks are made. The unexposed photoresistive material is then washed away leaving bare metal at the aperture locations. The shadow mask material is then exposed to acid which etches through the bare metal to produce the apertures. Typically, the shadow mask material is in the form of a long strip which is pulled through the etch line by a roller. The metal strip is coated on both sides and a large number of aperture patterns sequentially produced on the strip. A large number of masks are thus etched as the strip of material is pulled through a tank of etching acid. Problems frequently arise when the acid inert photoresistive material is not uniformly applied across both sides of the entire metal strip. The bare metal exposed by the voids in the photoresistive material is etched. When the voids occur on both sides of the strip they are completely etched through and the strip frequently is severed in the acid tank and the etch line must be shut down. On occasions when the void occurs on only one side of the strip only partial etching occurs. However, this also frequently results in a shutdown of the etch line because the partially etched metal is not strong enough to withstand the force required to pull the strip through the acid tank. In either event, the severing of the strip causes a shutdown of the etch line and requires entrance into the etch tank to retrieve and to repair the severed end.

The instant invention overcomes these problems by the provision of an apparatus which senses the bare metal exposed in the photoresist voids and generates a signal which can be used to cause the application of an acid resistant material to the metal strip to protect the strip during etching.

SUMMARY OF THE INVENTION

An apparatus for sensing bare metal on a moving strip of insulated conductive material includes a plurality of sensors, each of which includes a plurality of electrical contacts. When the insulation in the strip is acceptable, the sensors are electrically separated. When the insulation on the strip is unacceptable, contacts of two sensors are electrically connected through the conductive strip.

DETAILED DESCRIPTION OF THE PREFERRED EMBODIMENT

Figure 1:
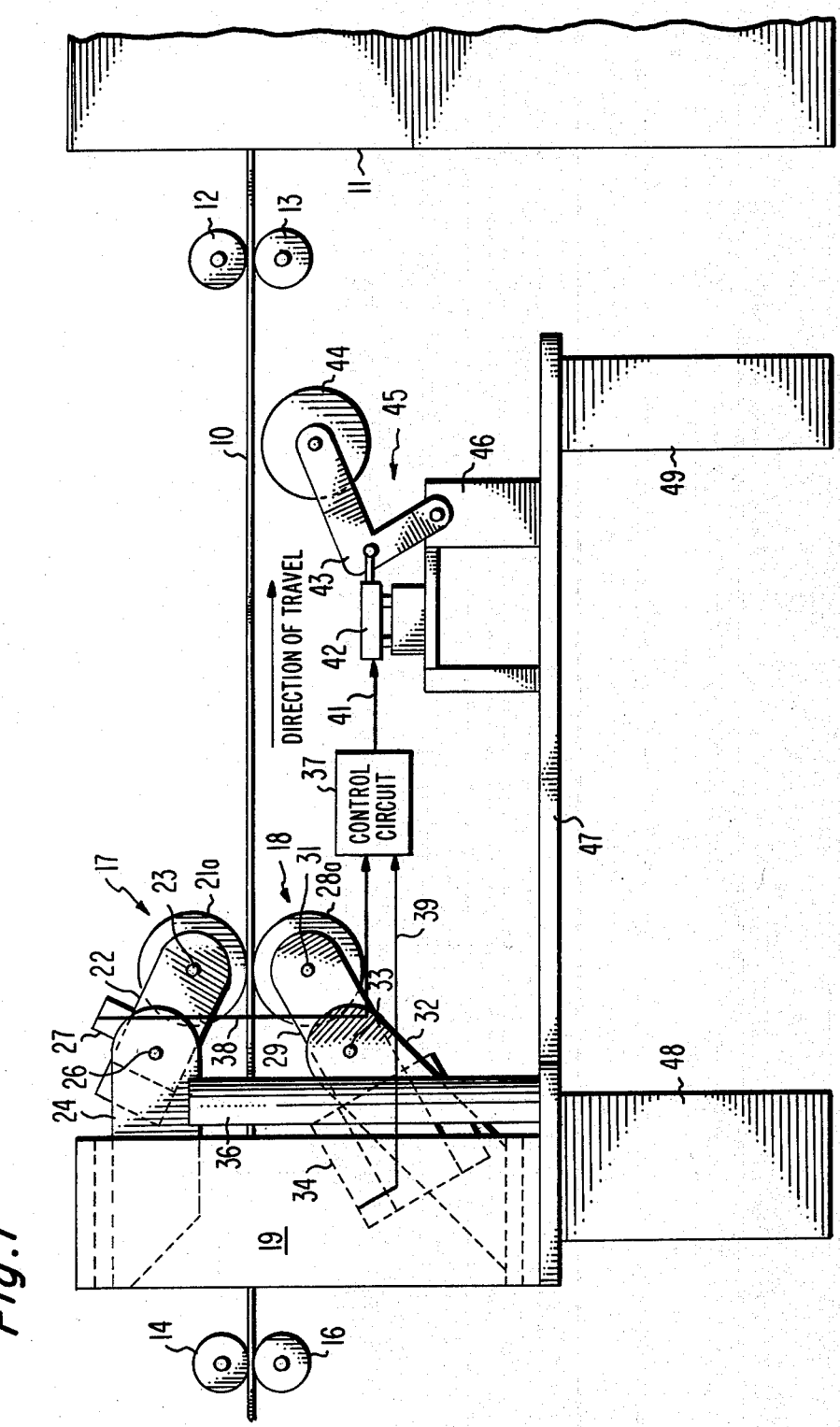
FIG. 1 shows a portion of a shadow mask etch line incorporating the preferred embodiment of a bare metal sensor.

FIG. 1 shows an apparatus for sensing bare metal incorporated into an etch line of known type. A strip of conductive material 10, which was previously coated on both sides with a photoresistive material and photographically exposed and developed to produce a bare metal aperture pattern thereon is pulled into an acid etch tank 11. The exposed photoresistive material protects the conductive strip 10 so that this portion of the strip is unaffected while the bare metal areas at the aperture locations are etched completely through. The roller which pulls the conductive strip 10 through the etch tank 11 and the other processing stages, such as rinsing and drying, are well known to those skilled in the art and are not shown or described herein. A plurality of rollers 12, 13, 14 and 16 are rotatably mounted in pairs to prevent vibration and to assure smooth travel of the strip 10. Bare metal exposed by voids in the photosensitive coating are sensed by two sensors 17 and 18 which respectively are mounted above and below the metal strip 10 on a mounting bracket 19.

Figure 2:
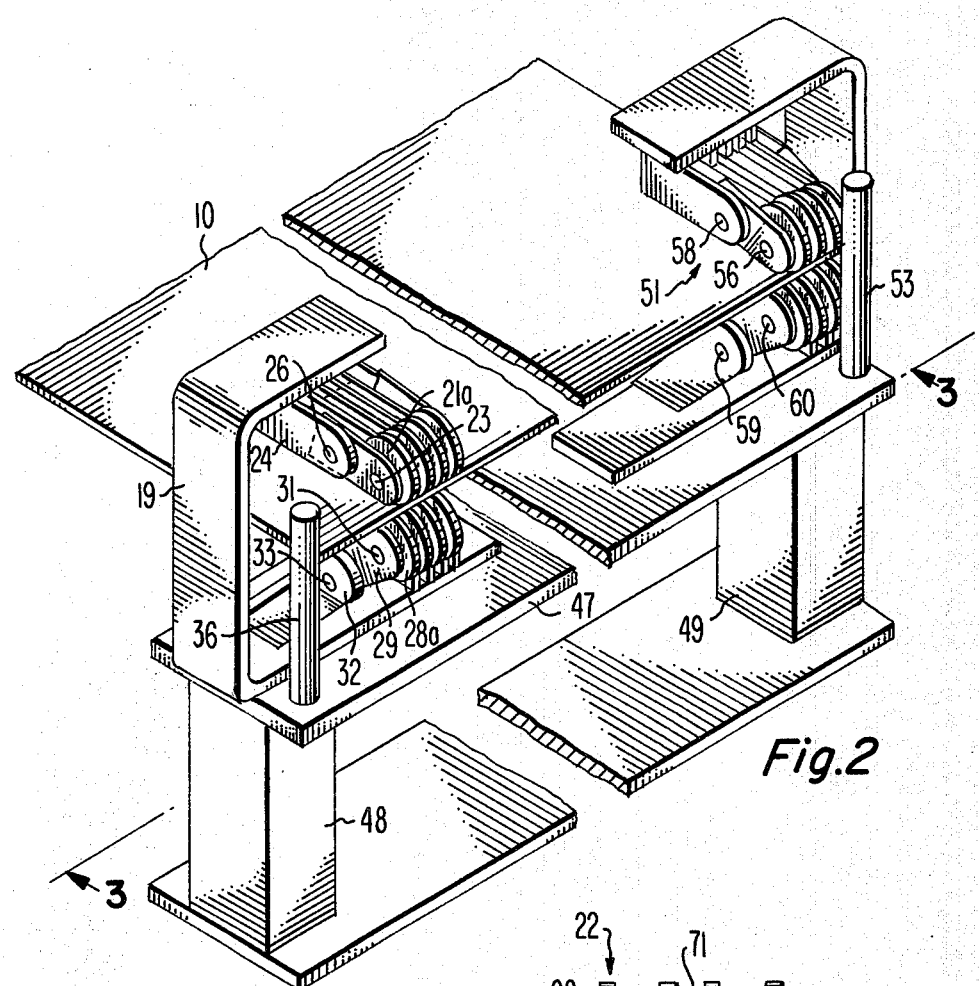
FIG. 2 is a perspective view of the preferred embodiment incorporated into FIG. 1.
Figure 3:
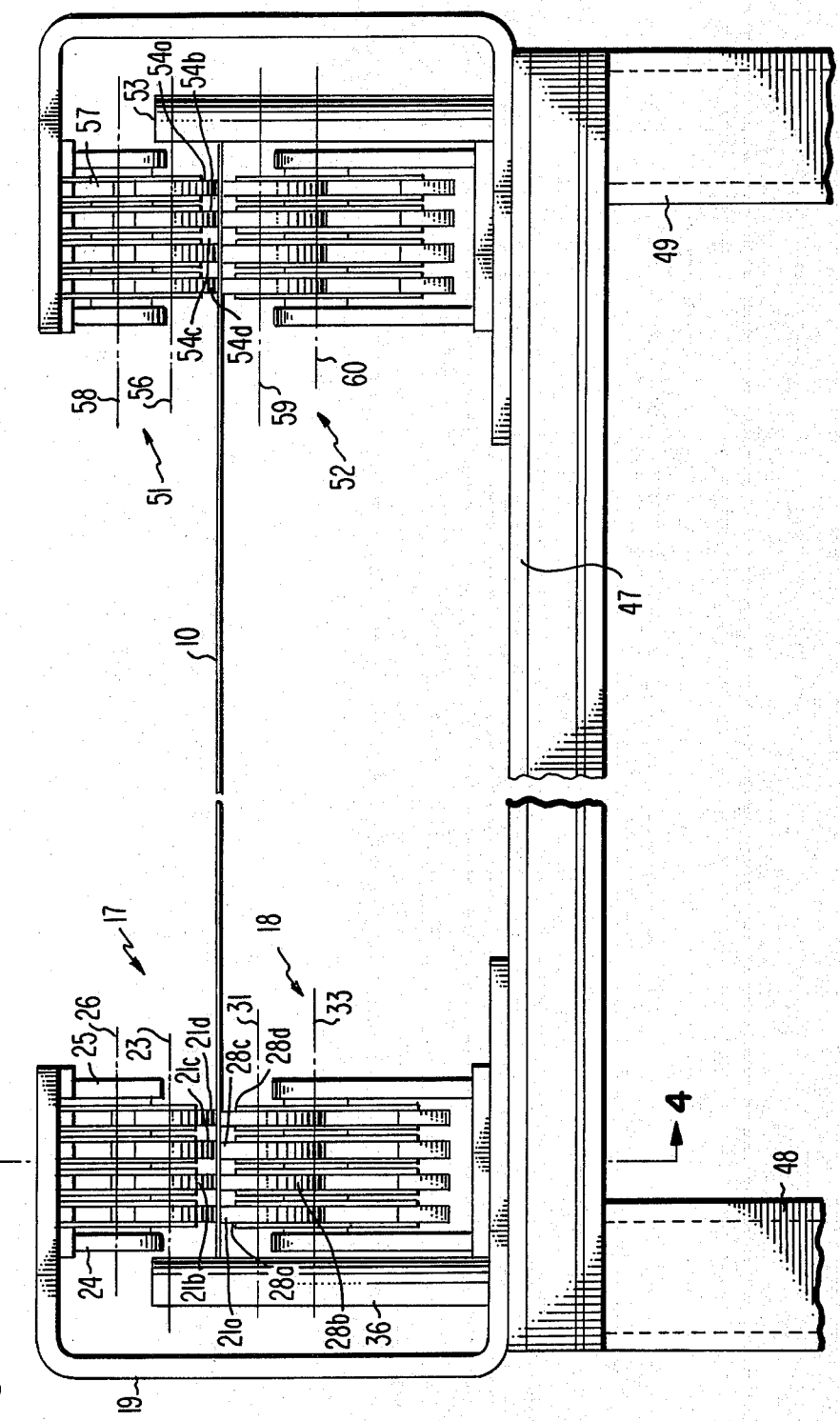
FIG. 3 is a view taken along line 3—3 of FIG. 2.

In FIGS. 2 and 3, the apparatus includes four sensors 17, 18, 51 and 52 arranged along both edges and on both sides of the strip 10. Each of the sensors 17, 18, 51 and 52 includes four individually pivotable electrical contacts. In each of the sensors, the electrical contact which is closest to the edge of the metal strip 10 is electrically grounded. The remaining three electrical contacts are biased with a voltage, such as 12 volts DC. When the metal strip 10 is properly coated with photoresistive material, all of the voltage biased electrical contacts are electrically insulated from the four grounded contacts. When the metal strip 10 is improperly coated and voids exist in the photoresistive material, one or more of the voltage biased electrical contacts will be electrically connected to one or more of the grounded electrical contacts through the bare metal exposed by the voids. In many instances, small areas of bare metal may not sufficiently weaken the metal strip to result in tearing. In such instances, the application of reinforcing material is not required. As an example, when the bare metal spot electrically connects the grounded electrical contact and any of the voltage biased electrical contacts of the same sensor, a small bare metal area is indicated and the reinforcing material is not required. However, when the bare metal area is present on both the top and bottom of the strip 10, or when bare metal is completely across either the top or bottom of the strip weakening sufficient to result in tearing could occur and the protective material is applied. Accordingly, whenever voltage biased electrical contacts of one sensor are electrically connected to the grounded contact of any other sensor the protective material is applied. The construction and operation of a control circuit which can be used with the instant invention are fully described in U.S. patent application Ser. No. 278,451, filed of even date herewith by Craig Deyer and entitled "System And Method For Use With Apparatus For Sensing Bare Metal On A Moving Strip Of Insulatively Coated Conductive Material" and assigned to RCA Corporation, the assignee of the instant application.

In FIG. 1, the sensor 17 includes a disc-shaped electrical contact 21a which is rotatably mounted on an arm 22 to rotate about a rotation axis 23. The arm 22 is pivotably coupled to a mounting member 24 at a pivot axis 26. The axes 23 and 26 are substantially parallel to the same surface of the metal strip 10. A counterweight 27 is arranged on the arm 22 in a position between the axes 23 and 26 to bias the arm 22 about the axis 26 thereby bringing the contact 21a against the upper surface of the metal strip 10. As the strip 10 moves the contact 21a rotates thereby minimizing wear on the contact. Vibration, or flapping, of the strip causes the arm 22 to pivot about the axis 26 assuring steady contact between the strip and the rotatable contact 21a.

The sensor 18 includes a disc-shaped electrical contact 28a rotatably mounted on an arm 29 at an axis 31. The arm 29 is pivotably coupled to a mounting member 32 at a pivot axis 33. The axes 31 and 33 are substantially parallel to the same surface of the metal strip 10 and are arranged beneath the strip 10. A counterweight 34 and the rotational axis 31 are arranged on opposite sides of the pivot axis 33 so that the counterweight biases the arm 29 toward the bottom surface of the metal strip 10.

The electrical contacts 21a and 28a are arranged near the edge of the metal strip 10. Transverse motion of the strip 10 between the sensors 17 and 18 is prevented by a guide rod 36.

The electrical contact 21a, the arm 22, and the counterweight 27 are made of electrically conductive material and are electrically coupled to a control circuit 37 by a lead 38. The electrical contact 28a, the arm 29 and the counterweight 34 of the sensor 18 also are electrically conductive and are coupled to the control circuit 37 by a lead 39. The control circuit 37 can be the type of circuit described in U.S. Pat. application Ser. No. 278,451, fully referenced hereinabove.

An output lead 41 of the control circuit 37 is connected to a taping mechanism 45. The taping mechanism 45 is of a type standard in the art and is available from several sources such as 3 M Corporation. The bare metal output signal from the control circuit 37 on output lead 41 actuates a solenoid 42 resulting in the pivoting of an arm 43 so that a roll of tape 44 is caused to contact the bottom surface of the metal strip 10, thereby applying a strip of tape to the bottom surface of the metal strip 10. If desired, several rolls of tape can be used to place several strips of tape onto either one or both sides of the metal strip 10.

The mounting bracket 19 and a mounting bracket 46 supporting the taping mechanism are arranged on a support plate 47 and are supported by way of mounting members 48 and 49. If desired, the brackets 19 and 46 can be free standing units and the need for plate 47 eliminated.

FIGS. 2 and 3 show the sensors 51 and 52 respectively mounted on opposite sides of the other edge of the metal strip 10. Another guide rod 53 is arranged along the other edge of the metal strip 10. The edges of the strip 10 slide along the guide rods 36 and 53 to prevent the metal strip 10 from transversely sliding between the sensors 17, 18, 51 and 52.

The sensor 17 includes three disc shaped electrical contacts 21b, 21c and 21d in addition to the contact 21a. The contacts 21b, 21c and 21d also are rotatable about the rotation axis 23 and are individually pivotably coupled to the pivot axis 26 by arms in the same manner as the contact 21a.

The sensor 18 includes three disc shaped electrical contacts 28b, 28c and 28d in addition to the contact 28a. The contacts 28b, 28c and 28d also are rotatable about the axis 31 and are individually pivotably coupled to the pivot axis 33 by arms in the same manner as the contact 28a. The sensor 51 is substantially identical to the sensor 17 and includes an electrical contact 54a arranged in the proximity of the edge of the metal strip 10 and three electrical contacts 54b, 54c and 54d. The contacts 54a, 54b, 54c and 54d are arranged to rotate about an axis 56.

Each of the electrical contacts 54 are individually pivotably coupled to an axis 58 by arms 57. The sensor 52 is substantially identical to the bottom sensor 18 and includes an axis 60 about which four electrical contacts rotate and an axis 59 about which the lower arms pivot.

Figure 4:
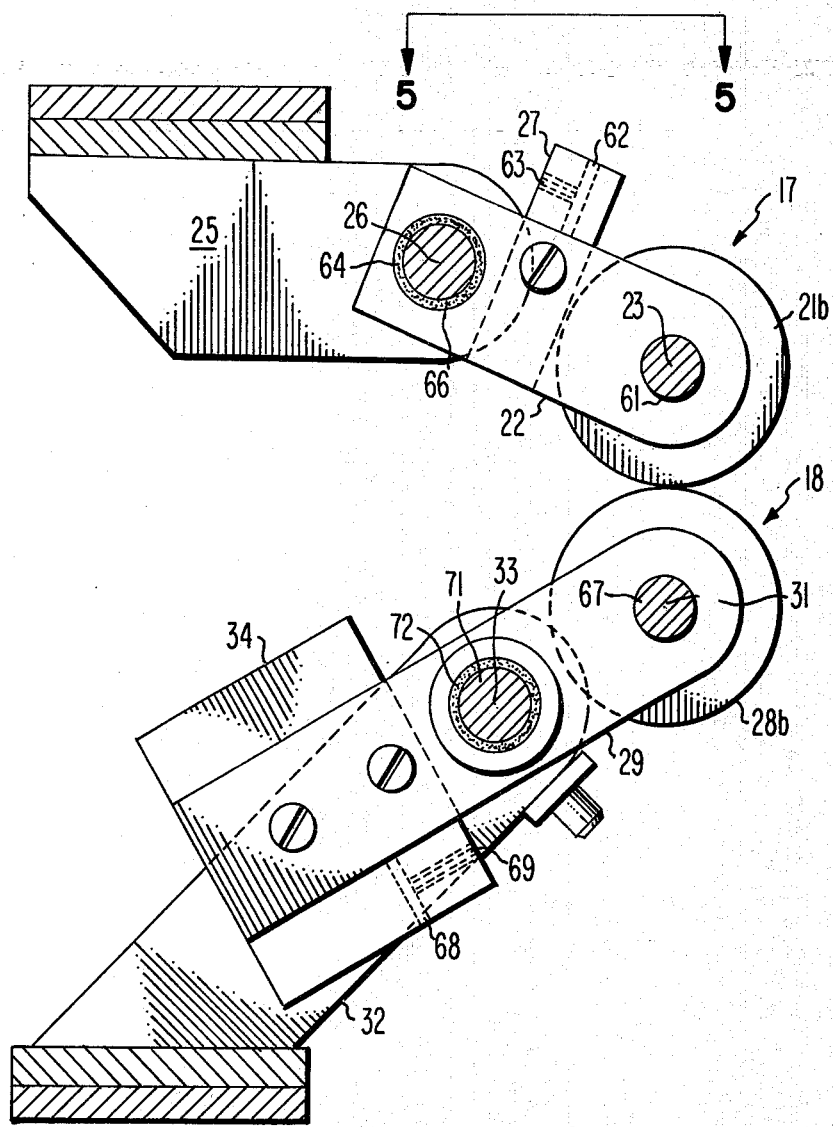
FIG. 4 is a view taken along line 4—4 of FIG. 3.

FIG. 4 shows the sensors 17 and 18 in more detail. Electrical contact 21b is rotatably mounted about the rotational axis 23 by way of a conductive pin 61. The contact 21b, pin 61, arm 22 and counterweight 27 are made of electrically conductive material so that electrical current can freely flow from the counterweight 27 to the contact 21b. Electrical contact is made between the counterweight 27 and the control circuit 37 by an electrical wire (not shown) which is inserted in a hole 62. A set screw 63 holds the wire in place. Electrical contact between the arm 22 and a pin 64 about which the arm pivots is prevented by an insulative bushing 66. The counterweight 27 is arranged between the pins 61 and 64 thereby causing the contact 21b to rotate toward the electrical contact 28b of the sensor 18. The contacts 21a, 21c and 21d are constructed and mounted in the same manner as the contact 21b.

The electrical contact 28b is rotatably mounted to the arm 29 by a conductive pin 67. The counterweight 34 includes a bore 68 to receive an electrical wire (not shown) which is held in place by a set screw 69. The arm 29 is insulated from the pivot pin 71 by an insulative bushing 72. Because the pivot axis 33 lies between the rotation axis 31 and the counterweight 34, the electrical contact 28b is rotated toward the contact 21b of the sensor 17. The rotational axes 23 and 31 are arranged so that the contacts 21a, 21b, 21c, 21d, and 28a, 28b, 28c and 28d touch opposite sides of the same position on the strip 10 and act against one another through the metal strip 10 so that the contacts do not tend to bend or otherwise deform the metal strip.

Figure 5:
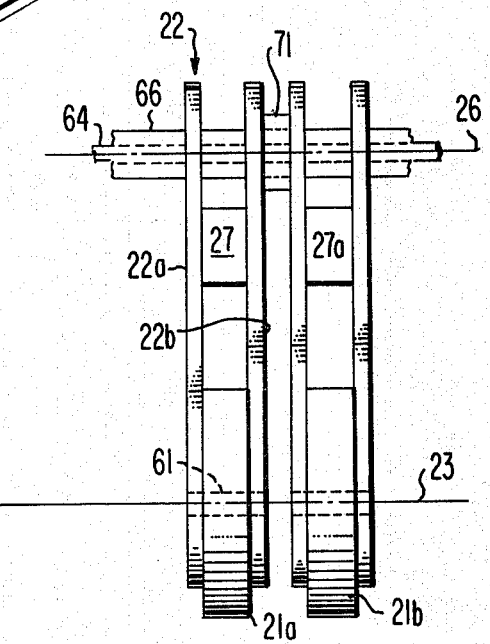
FIG. 5 is a view taken along line 5—5 of FIG. 4.

FIG. 5 shows the construction of the electrical contacts 21a, 21b, 21c, and 21d and the support arms 22 in more detail. The arms 22 include two spaced parallel bars 22a and 22b between which the electrical contact 21a is arranged. The bars 22a and 22b pivot on the insulative bushing 66 and thus are kept from electrical contact with the shaft 64 about which they pivot. Adjacent arms are kept spaced and insulated from one another by insulated bushings 71. The arms 22 thus are independently pivotable about the pivot axis 26 and each of the electrical contacts 21a, 21b, 21c, and 21d is individually electrically coupled to the control circuit 37.

All the electrical contacts of the four sensors 17, 18, 51 and 52 are individually pivotable about their respective pivot axes. Secondly, the pivoting of every electrical contact is independent of the pivoting of all other contacts. For this reason, all the electrical contacts ride on the strip 10 even if the strip begins to vibrate or enters into a wave motion.

What is claimed is:

1. Apparatus for sensing bare metal on a moving strip of substantially insulated conductive material comprising:

first sensor means including a first plurality of electrical contacts arranged to rest against one side of said strip;

second sensor means including a second plurality of electrical contacts arranged to rest against the other side of said strip, the contacts of said first and second sensors being electrically separated from one another by said strip when the insulating material on said strip is acceptable and at least some of the contacts of said sensors being electrically connected when said insulating material is unacceptable.

2. The apparatus of claim 1 wherein said electrical contacts are discs arranged with the edges resting on said strip whereby said discs rotate as said strip moves.

3. The apparatus of claim 2 wherein the discs of said first sensor are arranged to individually pivot about a first pivot axis oriented on said one side and substantially parallel to the plane of said strip, and wherein the discs of said second sensor are arranged to individually pivot about a second pivot axis oriented on said other side and substantially parallel to the plane of said strip.

4. The apparatus of claim 3 wherein said discs include means for pivoting said discs toward said strip.

5. The apparatus of claim 4 wherein said discs of said first sensor rotate about a first rotational axis displaced from said first pivot axis and further include arms for coupling said discs between said axes, said means for pivoting operating on said arms to pivot said discs toward said strip;

and wherein said discs of said second sensor rotate about a second rotational axis displaced from said second pivot axis and further include arms for coupling said discs between said axes, said means for pivoting operating on said arms to pivot said discs toward said strip.

6. The apparatus of claim 5 wherein said first and second sensors each include at least three discs, one of said discs of each sensor being electrically grounded and the rest of said discs being connectable to a voltage source.

7. The apparatus of claim 1 or 3 or 5 further including a third sensor means arranged to rest against said one side of said strip and a fourth sensor means arranged to rest against said other side of said strip.

8. The apparatus of claim 7 wherein said first and second sensors are arranged near one edge of said strip and said third and fourth sensor means are arranged near the other edge of said strip.

9. The apparatus of claim 7 further including means for applying acid resistant material to said strip when said first sensor electrically contacts one of said second or third sensors, and when said fourth sensor electrically contacts one of said second or third sensors.

10. The apparatus of claim 1 or 3 or 4 further including means for applying said resistant material to said strip when said first sensor electrically contacts said second sensor.

11. Apparatus for sensing and applying protective material to bare metal on a moving strip of substantially insulated conductive material comprising:

sensor means including a plurality of electrical contacts arranged to rest against one side of said strip, at least one of said contacts being electrically grounded and at least one other of said contacts being connectable to a voltage source; and means for applying a covering to said strip in response to continuity sensed between said at least one grounded contact and said at least one other contact.

12. The apparatus of claim 11 wherein said sensor means includes four sensors arranged along both edges and on both sides of said strip.

* * * * *